(12) United States Patent
Minami

(10) Patent No.: US 8,574,974 B2
(45) Date of Patent: Nov. 5, 2013

(54) METHOD OF MANUFACTURING A SEMICONDUCTOR DEVICE

(71) Applicant: Seiko Instruments Inc., Chiba (JP)

(72) Inventor: Yukimasa Minami, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 13/721,228

(22) Filed: Dec. 20, 2012

(65) Prior Publication Data

US 2013/0171782 A1 Jul. 4, 2013

(30) Foreign Application Priority Data

Dec. 21, 2011 (JP) ................... 2011-280118

(51) Int. Cl.
*H01L 21/336* (2006.01)
*H01L 21/8238* (2006.01)
*H01L 27/148* (2006.01)

(52) U.S. Cl.
USPC ........... 438/206; 438/268; 438/212; 438/200; 438/270; 257/330; 257/E21.643; 257/E27.064

(58) Field of Classification Search
USPC ................. 438/142, 197, 199, 212, 243, 268, 438/270–272, 200, 206; 257/328–330, 334, 257/278, 242, 268, 270, 288, 302, 332, 257/E27.064, E21.695, E21.696, E27.011, 257/E21.643
See application file for complete search history.

(56) References Cited

U.S. PATENT DOCUMENTS

| | | | | |
|---|---|---|---|---|
| 5,285,093 A | * | 2/1994 | Lage et al. | 257/332 |
| 6,844,578 B2 | * | 1/2005 | Harada et al. | 257/278 |
| 7,456,469 B2 | * | 11/2008 | Yamazaki | 257/330 |
| 7,714,381 B2 | * | 5/2010 | Robb et al. | 257/330 |
| 2007/0164353 A1 | * | 7/2007 | Mifuji et al. | 257/330 |

FOREIGN PATENT DOCUMENTS

JP 2002359294 12/2002

* cited by examiner

*Primary Examiner* — Mary Wilczewski
*Assistant Examiner* — Erik T Peterson
(74) *Attorney, Agent, or Firm* — Adams & Wilks

(57) ABSTRACT

Forming a photoresist on a region other than a region on a trench gate electrode for a mask, a third gate insulating film on the trench gate electrode is etched and removed. After that, a non-doped polycrystalline silicon layer is formed on second and third gate insulating films and also on the trench gate electrode, and, N-type and P-type high concentration impurities are introduced by an ion implantation with the use of separate masks on the polycrystalline silicon layer of NMOS transistors and PMOS transistors with a low breakdown voltage and a high breakdown voltage. Then, a second gate electrode is formed by anisotropic etching. With the steps as described above, a first gate electrode inside the trench and the second gate electrode to be used in the lateral MOS transistor are laminated, to thereby reduce fluctuations due to the etching.

6 Claims, 14 Drawing Sheets

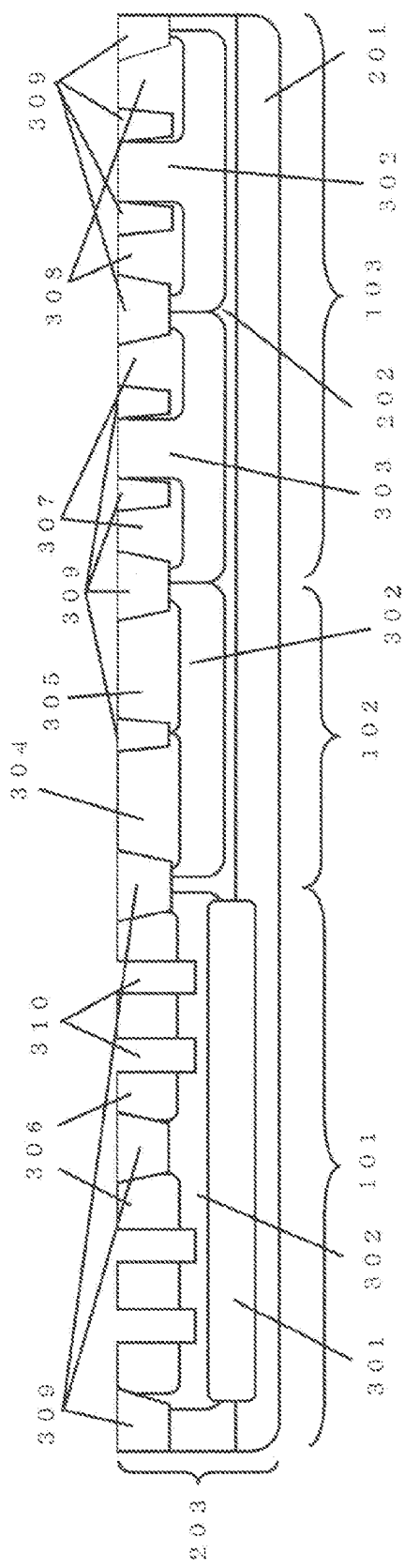

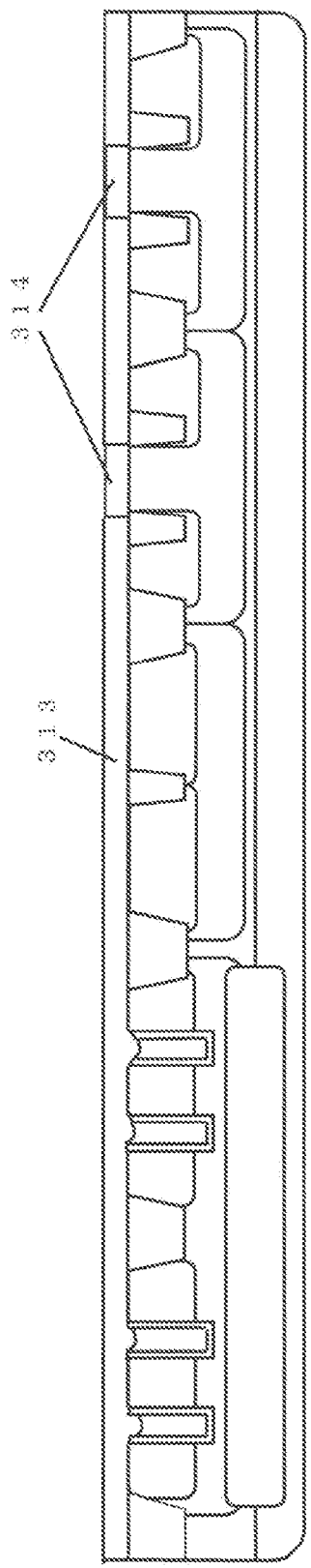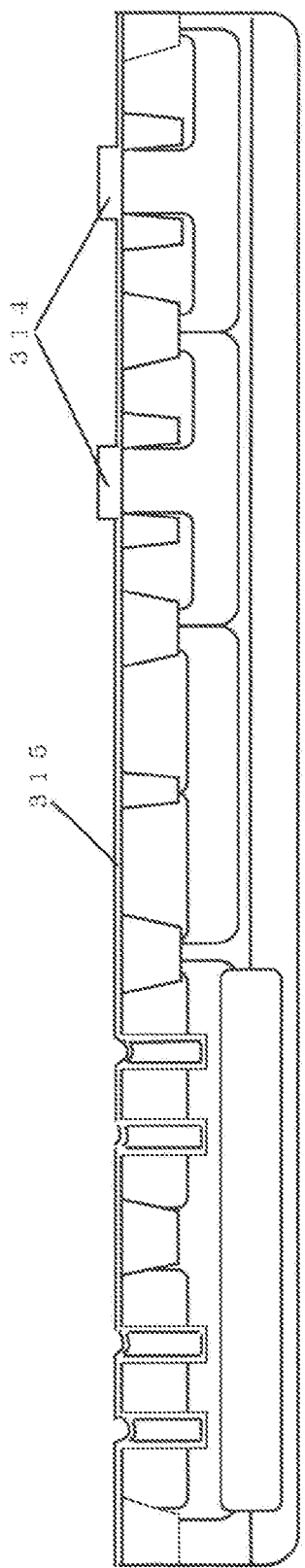

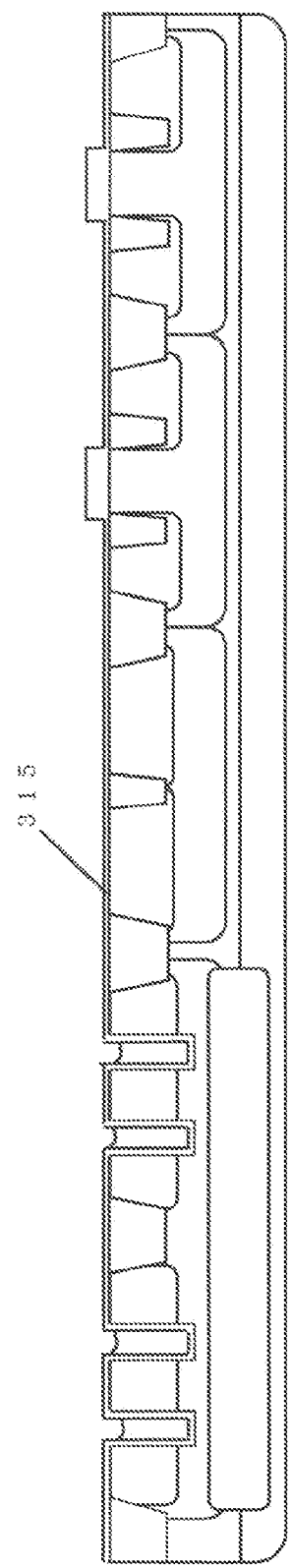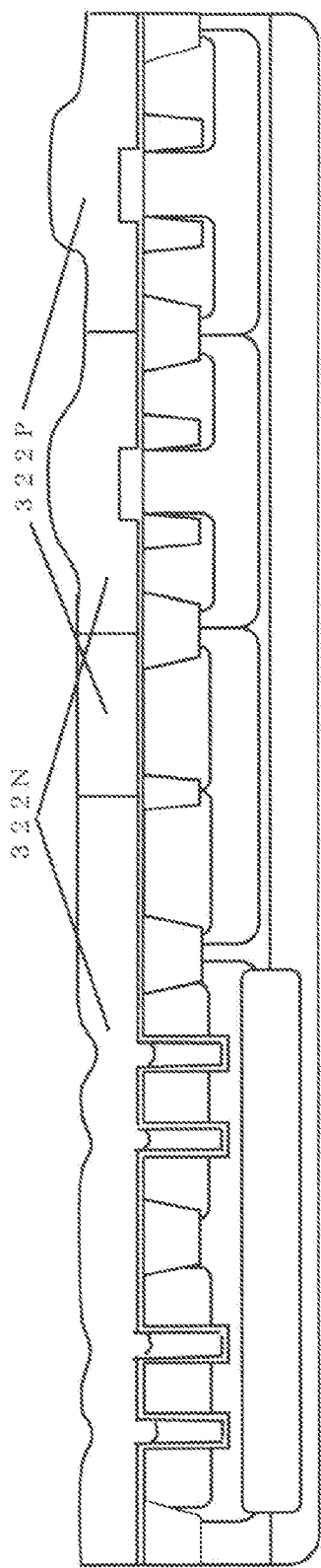

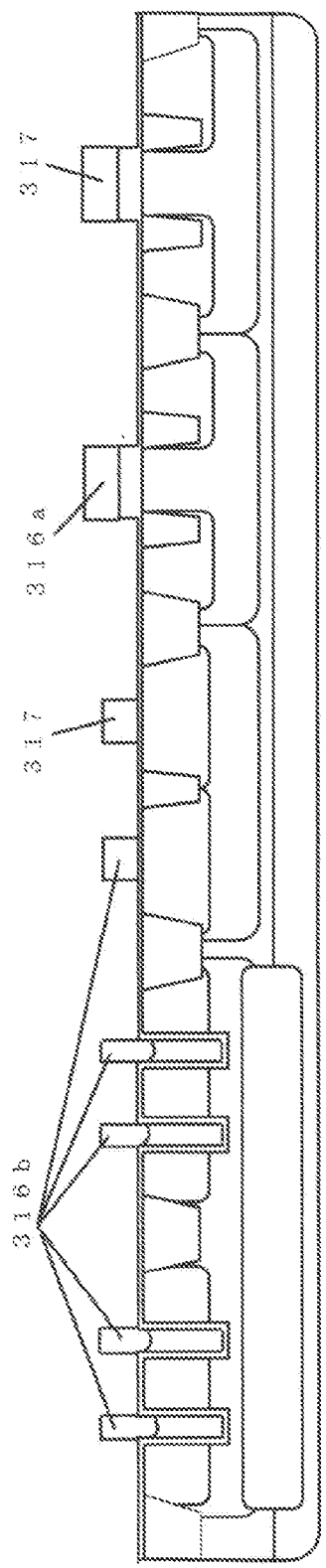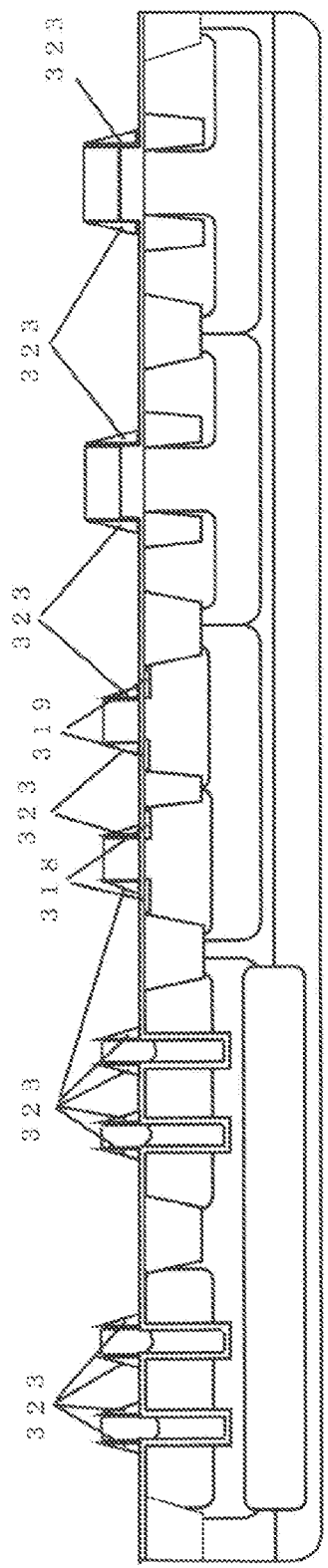

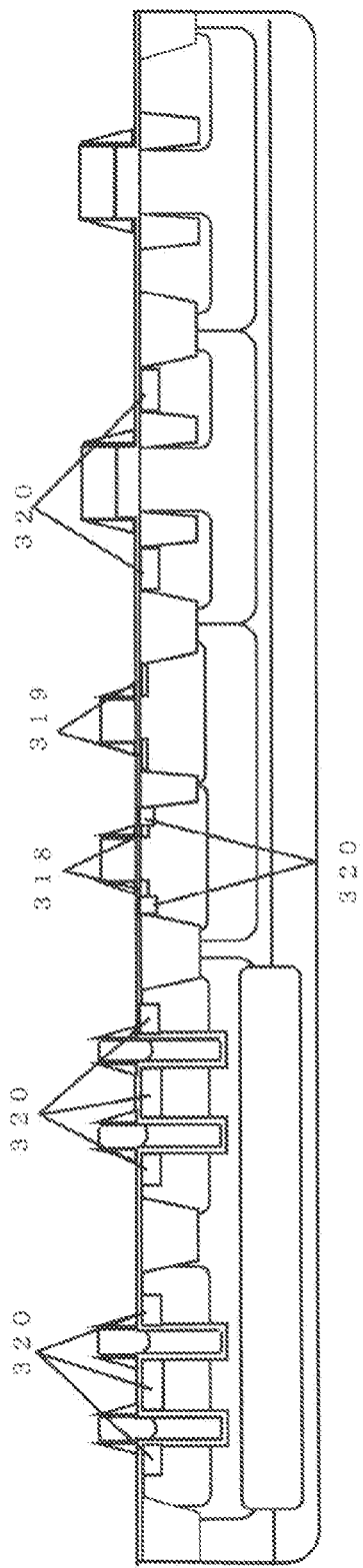
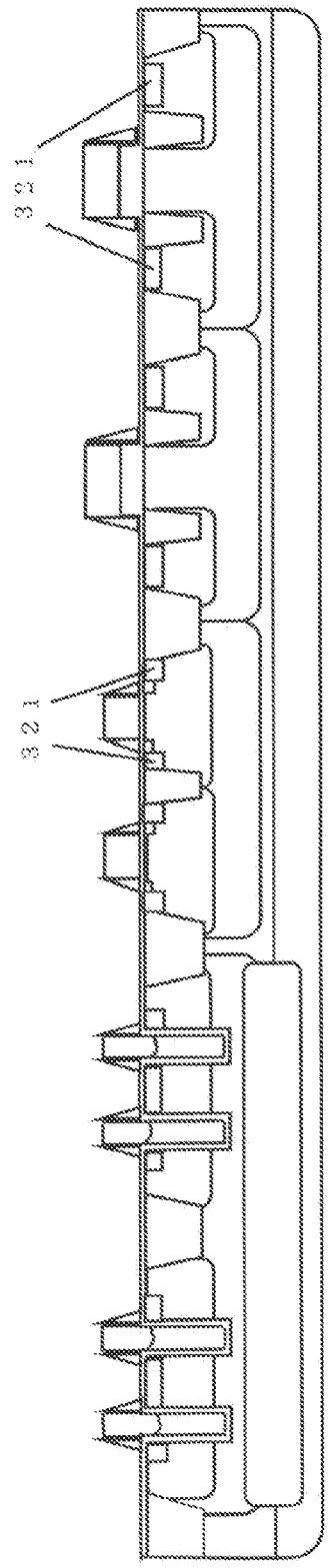

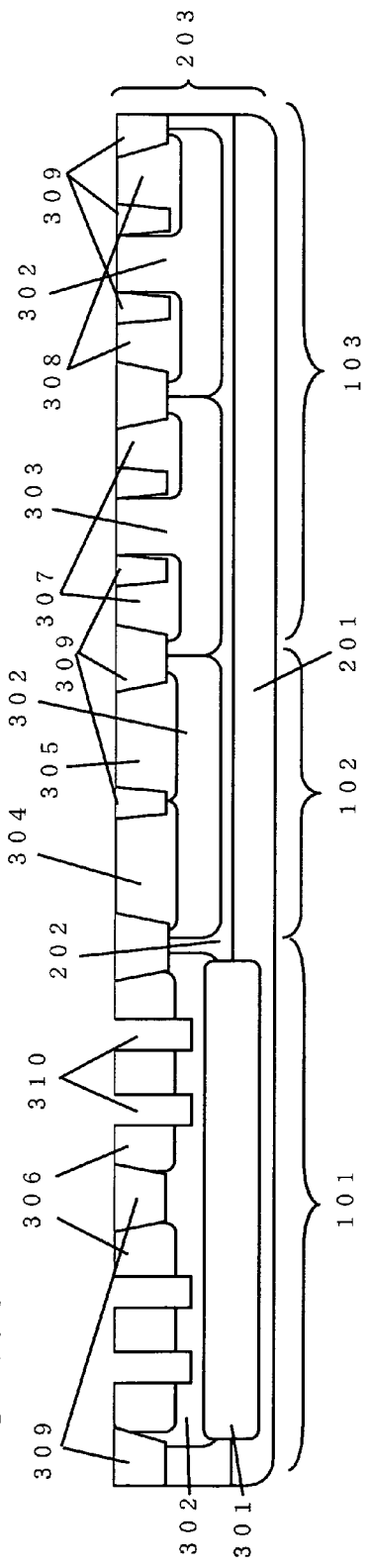
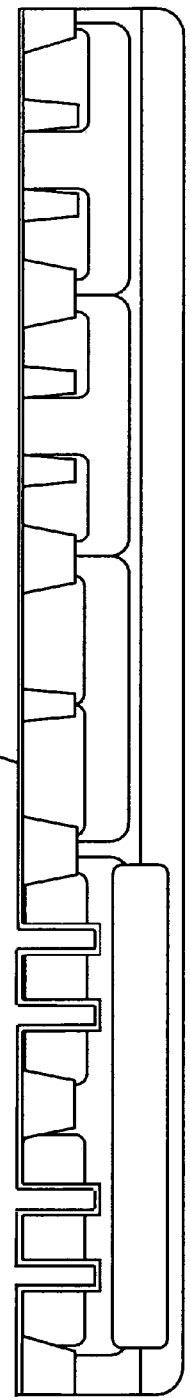
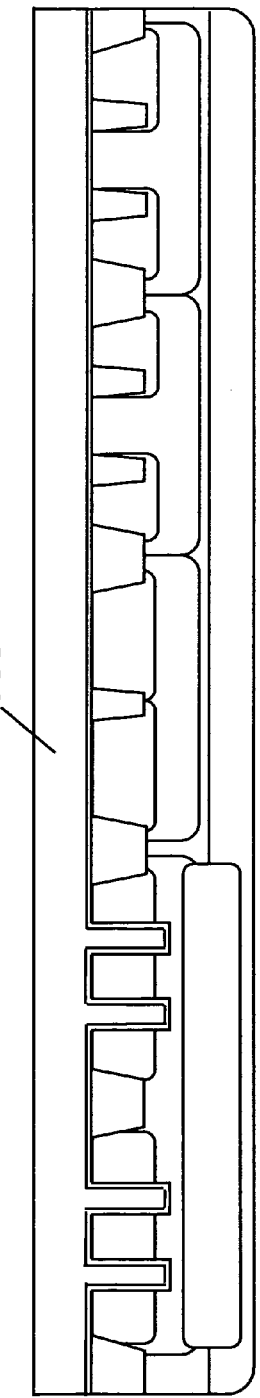
FIG. 7A
FIG. 7B
FIG. 7C

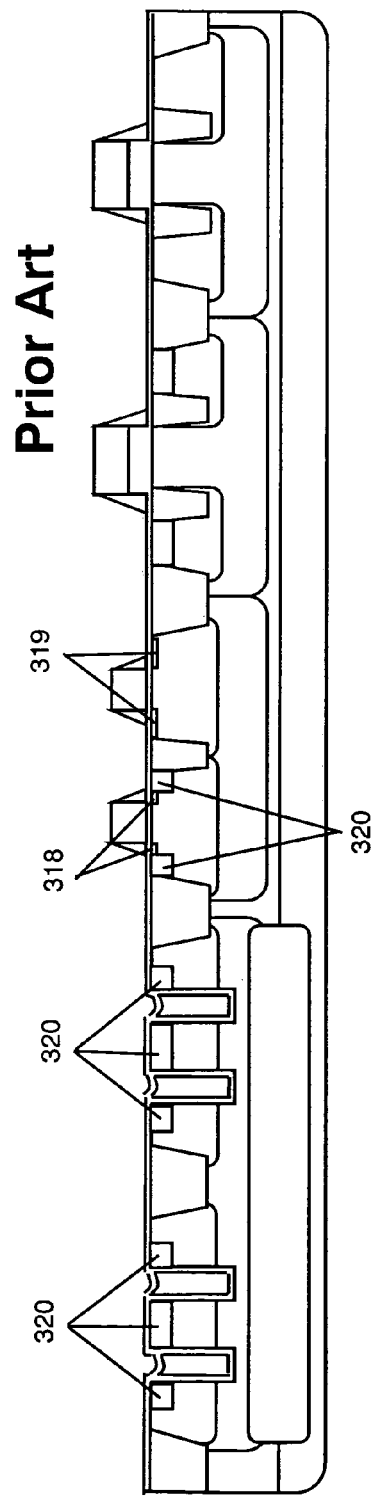
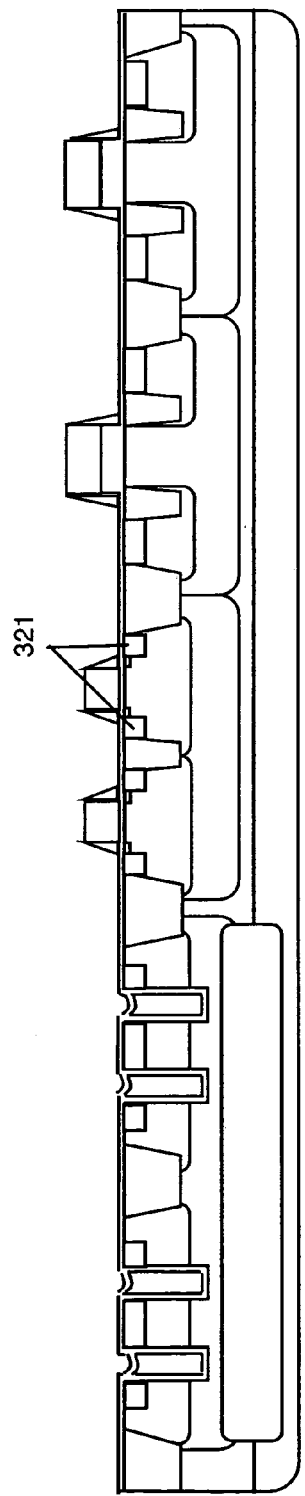
FIG. 14A Prior Art
FIG. 14B Prior Art

METHOD OF MANUFACTURING A SEMICONDUCTOR DEVICE

BACKGROUND OF THE INVENTION

1. Field of the Invention

The present invention relates to a method of manufacturing a semiconductor device in which lateral MOS transistors with a low breakdown voltage and lateral MOS transistors with a high breakdown voltage, both having a homopolar gate, and a vertical trench MOSFET are mounted together on a semiconductor substrate.

2. Description of the Related Art

In recent years, a wide variety of mobile devices have been distributed. As power sources for operating those mobile devices, Li-ion batteries have been heavily used, which have high energy density but generate no memory effect. Along therewith, a protection IC for detecting overcharge and overdischarge of the Li-ion battery has become essential. For example, a Li-ion battery for mobile phones has a battery voltage of about 3.6 V, but a voltage of 20 V or more may be applied during charging. Accordingly, it is required that the protection IC include an element having a high breakdown voltage.

In order that a CMOS transistor process can satisfy the specification of such a protection IC, it is necessary that the process can form a MOS transistor suitable for low voltage use and a MOS transistor suitable for high voltage use. This is because, in order to satisfy its specification, the high breakdown voltage element needs to have a certain element size. Then the final chip size increases when the entire IC is formed of high breakdown voltage elements, with the result that the IC has no cost-competitiveness, and it becomes difficult to satisfy the demand for market price. Accordingly, it is necessary to reduce the chip size by using high breakdown voltage elements only in circuit sections to which a high voltage is applied, and using low breakdown voltage elements in other circuit regions. Further, when a trench power MOSFET is embedded in the protection IC, it is demanded to further reduce the chip size and reduce the on-resistance of the power MOSFET.

In view of such demands, as a manufacturing process for a semiconductor device serving as the protection IC, it is necessary to establish a method of manufacturing a semiconductor device, which includes a low breakdown voltage process, a high breakdown voltage process, and a trench process in a mixed manner.

In the following, with reference to FIGS. 11A to 14B, simple description is given of a conventional method of manufacturing a semiconductor device in which lateral MOS transistors having a low breakdown voltage and a high breakdown voltage, each having a homopolar gate, and a vertical trench MOSFET, are mounted together. The manufacturing method relating to the following items (1) to (5) are not shown in the drawings, but the semiconductor device is first formed as described in the following items (1) to (5).

(1) A high concentration buried layer is formed in a trench forming region by an ion implantation method.
(2) A P-type epi-layer is formed on a base substrate made of a P-type semiconductor by an epitaxial method.
(3) Respective well layers of lateral MOS transistors of a low breakdown voltage element and a high breakdown voltage element, and a vertical trench MOSFET are formed by an ion implantation method.
(4) An element isolation region and an electric field relaxation region of the high breakdown voltage element are formed by a LOCOS method or a shallow trench method.
(5) A first low concentration region is formed in the electric field relaxation region of the high breakdown voltage element by an ion implantation method.

After that, the semiconductor device is formed as illustrated in FIGS. 11A to 14B. In this manner, there is formed a semiconductor device in which the lateral MOS transistors of a low breakdown voltage element 102 and a high breakdown voltage element 103 and a vertical trench MOSFET 101, each having a homopolar gate, are mounted together.

(a) In an N-type vertical MOS transistor 101 forming region on an N-type first well layer 302, a trench 310 is formed by performing anisotropic etching toward the inside of a P-type semiconductor substrate 203 to have a depth does not reach an N-type buried layer 301 (FIG. 11A).
(b) A first gate insulating film 311 is formed by thermal oxidation along a surface of the P-type semiconductor substrate 203 and a wall surface of the trench (FIG. 11B).
(c) A first polycrystalline silicon layer 312 doped with N-type ions is formed on the first gate insulating film 311 (FIG. 11C).
(d) The first polycrystalline silicon layer 312 is subjected to etching to form a gate electrode 312 inside the trench (FIG. 12A).
(e) A nitride film 313 is formed on the entire surface of the P-type semiconductor substrate 203. Then, a photoresist is formed in a region other than a region of the high breakdown voltage element by a photolithography method. With use of the photoresist as a mask, the nitride film 313 is etched and removed only in the region of the high breakdown voltage element, in which a gate insulating film thereof is to be formed. Then, a relatively-thick second gate insulating film 314 is formed by thermal oxidation (FIG. 12B).
(f) After the nitride film 313 is removed, on the entire surface of the P-type semiconductor substrate 203, a third gate insulating film 315 of the lateral MOS transistor for the low breakdown voltage element 102 is formed by thermal oxidation (FIG. 12C).
(g) A non-doped second polycrystalline silicon layer is formed on the second and third gate insulating films (314 and 315) and also on the trench gate electrode. Then, N-type high concentration impurities and P-type high concentration impurities are introduced by an ion implantation method with use of separate masks into the second polycrystalline silicon layer (316 and 317) for NMOS transistors and PMOS transistors of the low breakdown voltage element and the high breakdown voltage element (FIG. 13A).
(h) The second polycrystalline silicon layer is subjected to etching, and thus an N-type second gate electrode 316 and a P-type second gate electrode 317 of the lateral MOS transistors of the low breakdown voltage element and the high breakdown voltage element are formed (FIG. 13B).
(i) With use of the second gate electrode 316 in an N-type lateral MOS transistor formation region of the low breakdown voltage element 102 on a P-type second well layer 304 as a mask, N-type impurities are introduced in a self-aligning manner to form a second low concentration N-type impurity region 318. Further, with use of the second gate electrode 317 in a P-type lateral MOS transistor formation region of the low breakdown voltage element 102 on an N-type second well layer 305 as a mask, P-type impurities are introduced in a self-aligning manner to form a second low concentration P-type impurity region 319. After that, an oxide film is formed by a CVD method or the like, and then anisotropic etching is performed. Thus, an oxide film spacer 323 is formed on a side wall of each of the second gate electrodes 316 and 317 (FIG. 13C).

(j) In a region of the N-type lateral MOS transistor formation region of the low breakdown voltage element 102 on the P-type second well layer 304, the region being separated from the second gate electrode 316 thereof by a desired distance, and in a surface region of the N-type vertical MOS transistor formation region, the surface region being provided in contact with the trench 310, N-type high concentration impurities are introduced by an ion implantation method to form sources and drains 320 (FIG. 14A).

(k) In a region of the P-type lateral MOS transistor formation region of the low breakdown voltage element 102 on the N-type second well layer 305, the region being separated from the gate electrode thereof by a desired distance, P-type high concentration impurities are introduced by an ion implantation method to form high concentration P-type source and drain 321 (FIG. 14B).

Finally, although not shown, an interlayer insulating film is formed, and a hole for electrode formation is opened in the interlayer insulating film. Then, an aluminum electrode is formed.

In the conventional method of manufacturing a semiconductor device in which lateral MOS transistors of the low breakdown voltage element and the high breakdown voltage element and the vertical trench MOSFET, which each have a homopolar gate, are mounted together illustrated in FIGS. 11A to 14B, in the step of FIG. 12A, polycrystalline silicon is deposited to form the gate electrode inside the trench, and the polycrystalline silicon other than that inside the trench is entirely etched. Due to the etching fluctuations at this time, the thickness of the gate electrode inside the trench varies. With this variation, even when the source is subsequently formed on the P-type substrate surface, the source may not reach the gate electrode end. Thus, there may arise a problem in that the vertical trench MOSFET does not satisfy its specification of the drive capability characteristics.

SUMMARY OF THE INVENTION

The present invention has been made in view of such problems described above. In order to solve the above-mentioned problem, the present invention employs the following measures.

First, according to an exemplary embodiment of the present invention, there is provided a method of manufacturing a semiconductor device in which lateral MOS transistors having a low breakdown voltage and a high breakdown voltage and a vertical trench MOSFET, which each have a homopolar gate, are mounted together, the method including: an N-type buried layer forming step of forming an N-type buried layer in an N-type vertical MOS transistor forming region on a surface of a base substrate made of a P-type semiconductor; a P-type epitaxial growth layer forming step of forming a P-type epitaxial growth layer on the base substrate; an N-type first well layer forming step of forming an N-type first well layer on the epitaxial growth layer in forming regions of lateral MOS transistors for a low breakdown voltage element, a P-type lateral MOS transistor for a high breakdown voltage element, and the N-type vertical MOS transistor; a P-type first well layer forming step of forming a P-type first well layer in a forming region of an N-type lateral MOS transistor for the high breakdown voltage element; a P-type second well layer forming step of forming a P-type second well layer in the forming region of an N-type lateral MOS transistor for the low breakdown voltage element on the N-type first well layer; an N-type second well layer forming step of forming an N-type second well layer in the forming region of a P-type lateral MOS transistor for the low breakdown voltage element on the N-type first well layer; a body region forming step of forming a P-type body region in the N-type vertical MOS transistor formation region on the N-type first well layer; a step of forming an element isolation region and an electric field relaxation region of the high breakdown voltage element; a step of forming a first low concentration region in the electric field relaxation region of the high breakdown voltage element; a trench forming step of forming a trench in the N-type vertical MOS transistor forming region on the N-type first well layer by performing anisotropic etching toward an inside of a P-type semiconductor substrate so as to have a depth that does not reach the N-type buried layer; a first gate insulating film forming step of forming a first gate insulating film along a surface of the P-type semiconductor substrate and a wall surface of the trench; an N-type first polycrystalline silicon layer forming step of forming a polycrystalline silicon layer that is doped with N-type ions on the first gate insulating film; a first gate electrode forming step of subjecting the first polycrystalline silicon layer to etching to form a first gate electrode inside the trench; a second gate insulating film forming step of forming a relatively-thick second gate insulating film in a region in which a gate insulating film of the high breakdown voltage element is to be formed; a third gate insulating film forming step of forming a relatively-thin third gate insulating film of the lateral MOS transistors for the low breakdown voltage element on an entire surface of the P-type semiconductor substrate; an etching step of removing the third gate insulating film on the N-type first polycrystalline silicon layer in the trench; a second polycrystalline silicon layer forming step of forming a non-doped second polycrystalline silicon layer on the third gate insulating film; an introducing step of N-type and P-type high concentration impurities into the second polycrystalline silicon layer of the NMOS transistors and the PMOS transistors of the low breakdown voltage element and the high breakdown voltage element; a second gate electrode forming step of subjecting the second polycrystalline silicon layer to etching, to thereby form a second gate electrode on the first gate electrode of the trench and second gate electrodes of the lateral MOS transistors of the low breakdown voltage element and the high breakdown voltage element; a low concentration N-type region forming step of introducing N-type impurities in a self-aligning manner with use of the second gate electrode in the N-type lateral MOS transistor formation region on the P-type second well layer as a mask, to thereby form a second low concentration N-type impurity region; a low concentration P-type region forming step of introducing P-type impurities in a self-aligning manner with use of the second gate electrode in the P-type lateral MOS transistor formation region on the N-type second well layer as a mask, to thereby form a second low concentration P-type impurity region; an N-type source and drain forming step of introducing N-type impurities into a region of the N-type lateral MOS transistor formation region on the P-type second well layer, the region being separated from the second gate electrode of the N-type lateral MOS transistor by a desired distance, and into a region of the N-type vertical MOS transistor formation region, the region being provided in contact with the trench, to thereby form a high concentration N-type impurity region; and a P-type source and drain forming step of introducing P-type impurities into a region of the P-type lateral MOS transistor formation region on the N-type second well layer, the region being separated from the gate electrode of the P-type lateral MOS transistor by a desired distance, to thereby form a high concentration P-type impurity region.

Further, according to another exemplary embodiment of the present invention, in the method of manufacturing a semiconductor device in which the lateral MOS transistors of the low breakdown voltage element and the high breakdown voltage element and the vertical trench MOSFET, which each have a homopolar gate, are mounted together, the introducing step of N-type and P-type high concentration impurities into the second polycrystalline silicon layer of the NMOS transistors and the PMOS transistors of the low breakdown voltage element and the high breakdown voltage element, and the source and drain forming steps of introducing N-type and P-type impurities into the regions of the N-type and P-type lateral MOS transistor formation regions on the second well layers, the regions being separated from the second gate electrodes thereof by desired distances, and into the region of the N-type vertical MOS transistor formation region, the region being provided in contact with the trench, to thereby form the high concentration N-type impurity region and the high concentration P-type impurity region, are simultaneously carried out.

In the method of manufacturing a semiconductor device according to the present invention, after the above-mentioned step (f), a photoresist is formed in a region other than a region on the trench gate electrode by a photolithography method. With use of the photoresist as a mask, the third gate insulating film on the trench gate electrode is etched and removed. After that, the non-doped polycrystalline silicon layer is formed on the second and third gate insulating films and also on the trench gate electrode. Then, N-type and P-type high concentration impurities are introduced by an ion implantation method with use of separate masks into the polycrystalline silicon layer of the NMOS transistors and the PMOS transistors of the low breakdown voltage element and the high breakdown voltage element. Then, anisotropic etching is performed to form the second gate electrode. With the steps as described above, the first gate electrode inside the trench and the second gate electrode to be used in the lateral MOS transistor are laminated. Accordingly, even when the thickness of the gate electrode inside the trench varies due to the etching fluctuations, the problems that the source does not reach the gate electrode end and that the characteristic specification is not satisfied can be eliminated.

BRIEF DESCRIPTION OF THE DRAWINGS

In the accompanying drawings:

FIGS. 1A and 1B are schematic sectional views of a method of manufacturing a semiconductor device according to a first embodiment of the present invention;

FIGS. 3A and 3B are schematic sectional views of the method of manufacturing a semiconductor device according to the first embodiment of the present invention, which follow FIG. 2B;

FIGS. 4A and 4B are schematic sectional views of the method of manufacturing a semiconductor device according to the first embodiment of the present invention, which follow FIG. 3B;

FIGS. 5A and 5B are schematic sectional views of the method of manufacturing a semiconductor device according to the first embodiment of the present invention, which follow FIG. 4B;

FIGS. 6A and 6B are schematic sectional views of the method of manufacturing a semiconductor device according to the first embodiment of the present invention, which follow FIG. 5B;

FIGS. 7A to 7C are schematic sectional views of a method of manufacturing a semiconductor device according to a second embodiment of the present invention;

FIGS. 14A and 14B are schematic sectional views of the conventional method of manufacturing a semiconductor device, which follow FIG. 13C.

DETAILED DESCRIPTION OF THE PREFERRED EMBODIMENTS

Figure 2A:
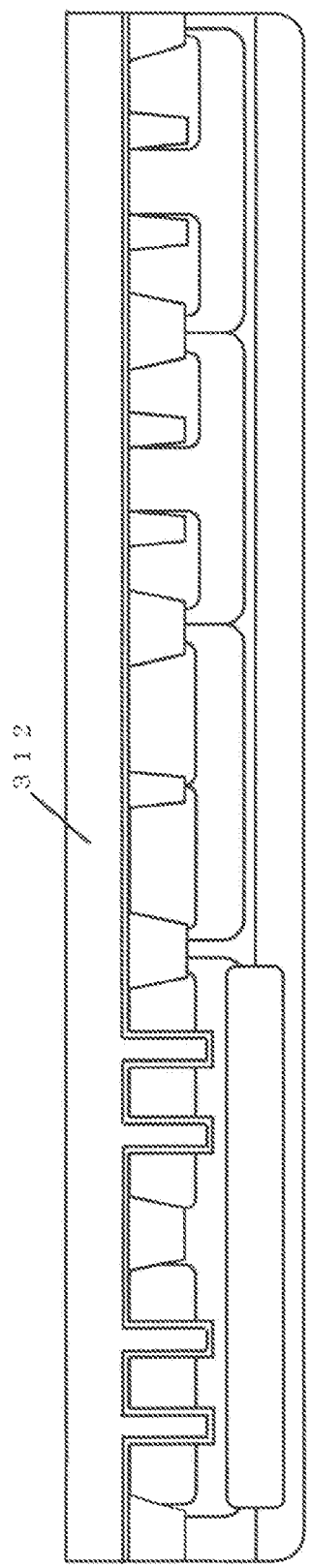
FIGS. 2A and 2B are schematic sectional views of the method of manufacturing a semiconductor device according to the first embodiment of the present invention, which follow FIG. 1B.

In the following, embodiments of the present invention are described with reference to the drawings.

(First Embodiment)

A first embodiment of the present invention is described with reference to FIGS. 1A to 6B. FIGS. 1A to 6B illustrate a method of manufacturing a semiconductor device of the present invention, the semiconductor device including lateral MOS transistors of a low breakdown voltage element and a high breakdown voltage element and a vertical trench MOSFET, which each have a homopolar gate and are mounted together on the semiconductor device.

At the beginning, steps for forming the structure of FIG. 1A are described. First, a base substrate 201 made of a P-type semiconductor is prepared, and an N-type high concentration buried layer 301, which subsequently becomes a drain of an N-type vertical trench MOSFET 101, is formed by an ion implantation method. The impurity concentration needs to be set so that the drain resistance of the N-type vertical trench MOSFET 101 is reduced as much as possible, and is desired to be about $1 \times 10^{21}/cm^3$.

Next, by an epitaxial method, a P-type epi-layer 202 is formed on the base substrate 201 to form a P-type semiconductor substrate 203. The thickness and the impurity concentration of the P-type epi-layer 202 are determined based on the performance required in the semiconductor integrated device to be produced, such as the breakdown voltage and the driving current of the MOSFET. In this case, the concentration is in the order of about $1 \times 10^{15}/cm^3$ and the thickness is about several micrometers to ten and several micrometers. Next, an N-type first well layer 302 is formed in each of a region for a lateral PMOS transistor in a low breakdown voltage element region 102, a region for a lateral PMOS transistor in a high breakdown voltage element region 103, and the vertical trench MOSFET region 101, each of which is provided on the P-type epi-layer 202. At this time, the N-type first well layer 302 is formed by impurity implantation and high-temperature heat treatment so as to have a depth that reaches the N-type high concentration buried layer 301 in the region including the N-type high concentration buried layer 301.

Description is given above of a case where the N-type well layers 302 for the lateral PMOS transistors of the low breakdown voltage element region 102 and the high breakdown voltage element region 103 are simultaneously formed. Alternatively, however, separate masks may be prepared to form the N-type well layers exclusively. When the N-type well layers are formed with use of separate masks, it is possible to form an N-type well layer which is adjusted to the characteristics of the vertical trench MOSFET. For example, the N-type well layer for the vertical trench MOSFET can be formed to have a higher impurity concentration than the N-type first well layers necessary for the lateral PMOS transistor regions of the low breakdown voltage element region 102 and the high breakdown voltage element region 103, and can be formed to have a larger diffusion depth. Particularly, the N-type first well layer 302 functions as a low concentration drain in the vertical trench MOSFET, and hence increase of the concentration thereof may be demanded in order to improve the drive capability thereof. In the similar way, in a lateral NMOS transistor region of the high breakdown voltage element, a P-type first well layer 303 is formed by impurity implantation and high-temperature heat treatment.

Next, in a region of the low breakdown voltage element region 102 on the N-type first well layer 302, in which the lateral NMOS transistor is to be formed, a P-type second well layer 304 having a surface concentration in the order of $1\times10^{17}/cm^3$ is formed with use of a mask by impurity implantation and high-temperature heat treatment. In addition, in a region thereof in which the lateral PMOS transistor is to be formed, an N-type second well layer 305 having a surface concentration in the order of $1\times10^{17}/cm^3$ is formed with use of another mask by impurity implantation and high-temperature heat treatment.

Next, in the region of the N-type vertical trench MOSFET 101, a P-type body region 306 for forming a channel of the N-type vertical trench MOSFET 101 is formed by impurity implantation and high-temperature heat treatment. Conditions accordingly change depending on the junction breakdown voltage with respect to the N-type high concentration drain to be formed later or the drive capability, but it is desired that the surface concentration be in the order of $1\times10^{17}/cm^3$.

Next, a field insulating film 309 is formed by a LOCOS method or a shallow trench method, to thereby form an element isolation region and an electric field relaxation region of the high breakdown voltage element 103. Next, in an electric field relaxation region of the NMOS transistor and an electric field relaxation region of the PMOS transistor of the high breakdown voltage element region 103, N-type low concentration impurities and P-type low concentration impurities are introduced by an ion implantation method with use of separate masks, respectively. In this manner, an N-type first low concentration region 307 and a P-type first low concentration region 308 are formed.

Then, in the N-type vertical MOSFET 101 forming region on the N-type first well layer 302, a trench 310 is formed by performing anisotropic etching toward the inside of the P-type semiconductor substrate 203 to have a depth that does not reach the N-type buried layer 301. Through the above-mentioned steps, the structure of FIG. 1A is obtained.

Subsequently, as illustrated in FIG. 1B, a first gate insulating film 311 is formed by thermal oxidation along a surface of the P-type semiconductor substrate 203 and a wall surface of the trench. The thickness thereof is about 10 nm to 20 nm.

Next, as illustrated in FIG. 2A, polycrystalline silicon doped with N-type ions is deposited on the first gate insulating film 311 by a low pressure CVD method or the like to form a film having a thickness of about 0.5 μm to 1 μm. As another method, non-doped polycrystalline silicon is deposited on the first gate insulating film 311, and then N-type impurities are ion-implanted. Thus, a first polycrystalline silicon layer 312 can be formed.

Figure 2B:
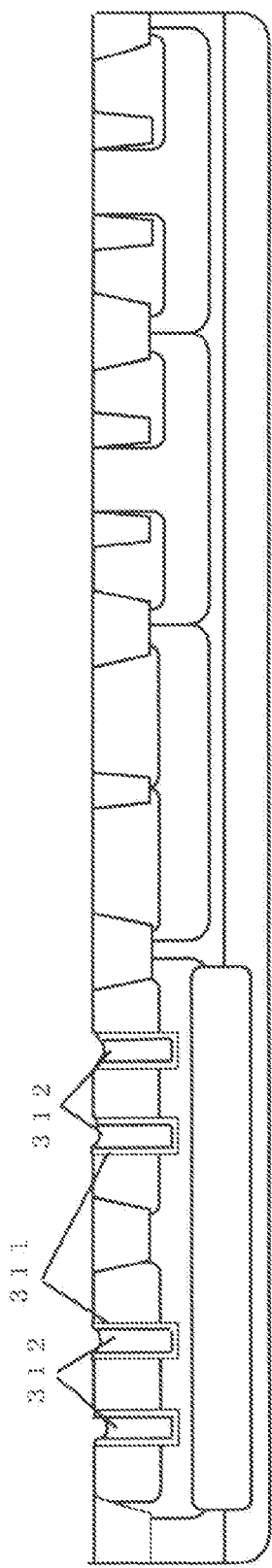
Figure 8A:
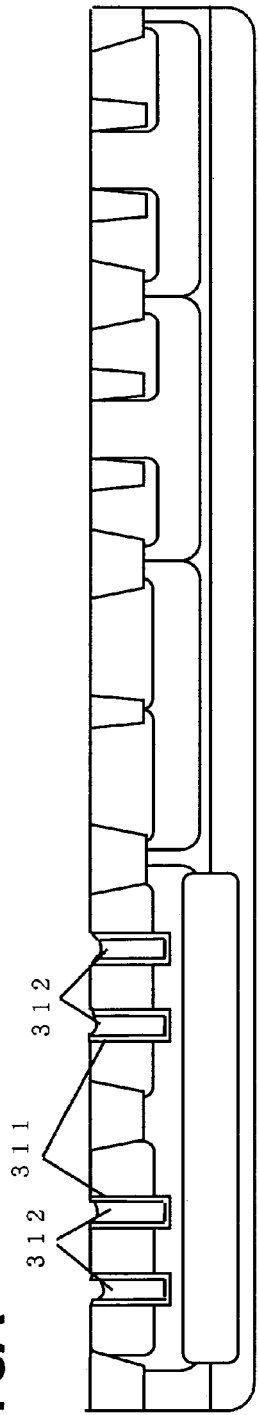
FIGS. 8A to 8C are schematic sectional views of the method of manufacturing a semiconductor device according to the second embodiment of the present invention, which follow FIG. 7C.
Figure 8B:
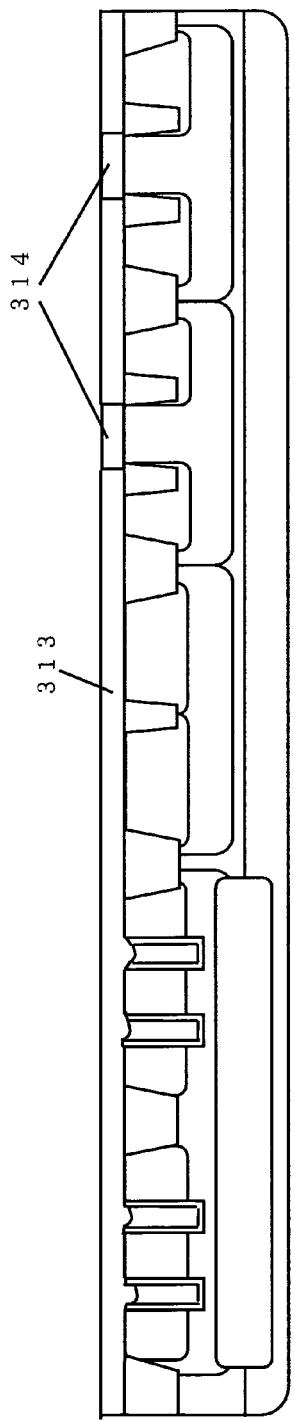
Figure 8C:
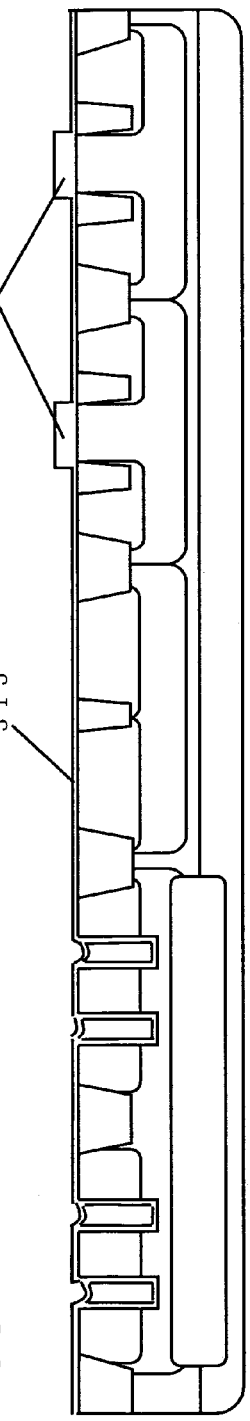
Figure 9A:
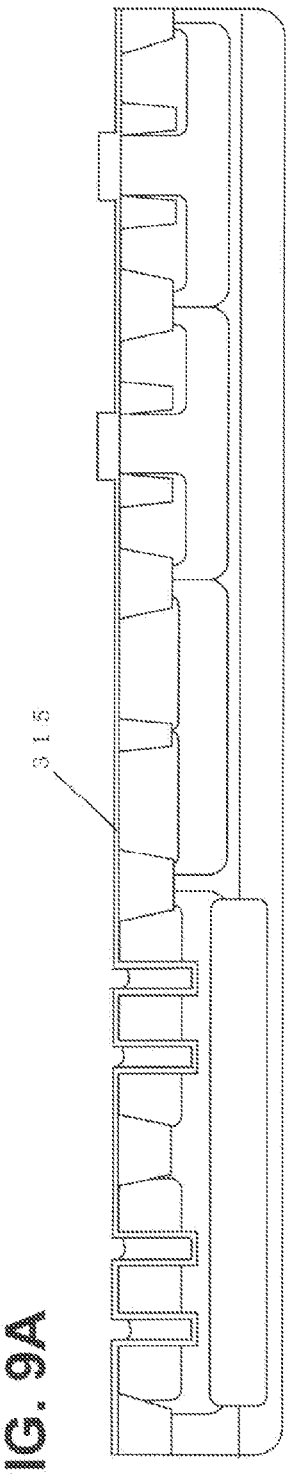
FIGS. 9A to 9C are schematic sectional views of the method of manufacturing a semiconductor device according to the second embodiment of the present invention, which follow FIG. 8C.
Figure 9B:
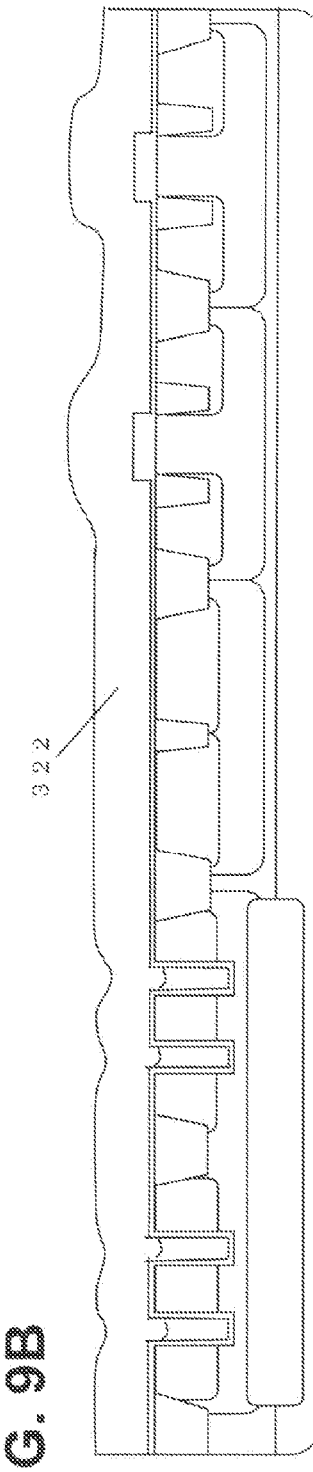
Figure 9C:
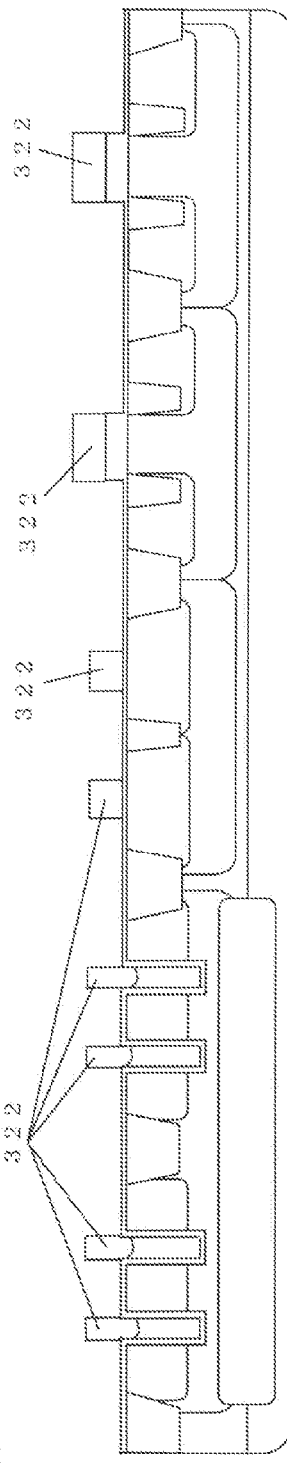

Subsequently, as illustrated in FIG. 2B, the first polycrystalline silicon layer 312 is subjected to anisotropic etching, to thereby form an N-type first gate electrode 312 formed of the first polycrystalline silicon layer 312 inside the trench.

Next, as illustrated in FIG. 3A, a nitride film 313 is formed on the entire surface of the P-type semiconductor substrate 203. Then, a photoresist is formed in a region other than a region of the high breakdown voltage element by a photolithography method. With use of the photoresist as a mask, the nitride film 313 is etched and removed only in the region of the high breakdown voltage element, in which a gate insulating film thereof is to be formed. Then, a relatively-thick second gate insulating film 314 is formed by thermal oxidation. The thickness thereof is about 50 nm to 100 nm.

After the nitride film 313 is removed, on the entire surface of the P-type semiconductor substrate 203, a relatively-thin third gate insulating film 315 of the lateral MOS transistor for the low breakdown voltage element 102 is formed by thermal oxidation (FIG. 3B). The thickness thereof is about 10 nm to 20 nm.

Next, as illustrated in FIG. 4A, a photoresist is formed in a region except for the region on the trench gate electrode by a photolithography method. With use of the photoresist as a mask, the third gate insulating film 315 grown on the trench gate electrode is etched and removed.

After that, a non-doped second polycrystalline silicon layer 322 is formed on the second and third gate insulating films (314 and 315) and also on the trench gate electrode. Then, N-type high concentration impurities around $1\times10^{21}/cm^3$ are introduced by an ion implantation method with use of a mask into regions in which the N-type vertical trench MOSFET 101, the lateral NMOS transistor of the low breakdown voltage element region 102, and the lateral NMOS transistor of the high breakdown voltage element region 103 are to be formed. In addition, P-type high concentration impurities are introduced by an ion implantation method with use of another mask into regions in which the lateral PMOS transistor of the low breakdown voltage element region 102 and the lateral PMOS transistor of the high breakdown voltage element region 103 are to be formed, to thereby obtain a conductivity type of P-type (FIG. 4B). In this manner, an N-type polycrystalline silicon layer 322N and a P-type polycrystalline silicon layer 322P are formed.

Subsequently, as illustrated in FIG. 5A, the second polycrystalline silicon layer 322 is subjected to anisotropic etching, to thereby form an N-type second gate electrode 316a and a P-type second gate electrode 317 of the lateral MOS transistors of the low breakdown voltage element and the high breakdown voltage element. At this time, an N-type second gate electrode 316b is also formed by performing etching and removal so that the N-type second gate electrode 316b is laminated on the N-type first gate electrode 312 of the N-type vertical trench MOSFET.

Next, as illustrated in FIG. 5B, with use of the second gate electrode 316b in the N-type lateral MOS transistor formation region of the low breakdown voltage element 102 on the P-type second well layer 304 as a mask, N-type impurities around $1\times10^{18}/cm^3$ are introduced in a self-aligning manner to form a second low concentration N-type impurity region 318. In addition, with use of the second gate electrode 317 in the P-type lateral MOS transistor formation region of the low breakdown voltage element 102 on the N-type second well layer 305 as a mask, P-type impurities around $1\times10^{17}/cm^3$ are introduced in a self-aligning manner to form a second low concentration P-type impurity region 319. After that, an oxide film of 300 nm to 600 nm is formed by a CVD method or the like, and then anisotropic etching is performed. Thus, an oxide film spacer 323 is formed on a side wall of each of the second gate electrodes 316a, 316b, and 317.

Subsequently, in a region of the N-type lateral MOS transistor formation region of the low breakdown voltage element 102 on the P-type second well layer 304, the region being separated from the second gate electrode 316b thereof by a desired distance, and in a surface region the N-type vertical MOS transistor formation region, the surface region being provided in contact with the trench 310, N-type high concentration impurities are introduced by an ion implantation method to form sources and drains 320 (FIG. 6A).

Next, in a region of the P-type lateral MOS transistor formation region of the low breakdown voltage element 102 on the N-type second well layer 305, the region being separated from the gate electrode thereof by a desired distance, P-type high concentration impurities are introduced by an ion implantation method to form high concentration P-type source and drain 321 (FIG. 6B). In the case of the N-type, impurities of phosphorus or arsenic are used, and in the case of the P-type, impurities of boron or BF2 are used. Each impurity region has an impurity concentration of about $1\times10^{21}/cm^3$.

Finally, although not shown, an interlayer insulating film is formed, and a hole for electrode formation is opened in the interlayer insulating film. Then, an aluminum electrode is formed. In this manner, a semiconductor device in which lateral MOS transistors of the low breakdown voltage element and the high breakdown voltage element and a vertical trench MOSFET, which each have a homopolar gate, are mounted together is completed. In the semiconductor device configured as described above, the gate electrode of the vertical trench MOSFET has a laminated structure of the N-type first gate electrode 312 and the N-type second gate electrode 316, and hence even when the thickness of the gate electrode inside the trench varies due to the etching fluctuations, the problems that the source does not reach the gate electrode end and that the characteristic specification is not satisfied can be eliminated.

(Second Embodiment)

Next, with reference to FIGS. 7A to 10C, a summary of a manufacturing method according to a second embodiment of the present invention is described. Similarly to the first embodiment, the second embodiment also describes a method of manufacturing a semiconductor device in which lateral MOS transistors of a low breakdown voltage element and a high breakdown voltage element and a vertical trench MOSFET, which each have a homopolar gate, are mounted together. The steps of this embodiment illustrated in FIGS. 7A to 9A are the same as those of the first embodiment illustrated in FIGS. 1A to 4A. Accordingly, differences from the first embodiment are described below.

Figure 10A:
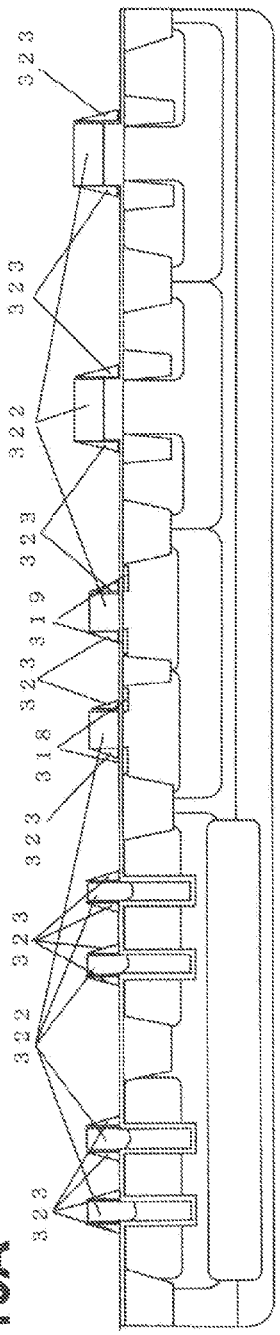
FIGS. 10A to 10C are schematic sectional views of the method of manufacturing a semiconductor device according to the second embodiment of the present invention, which follow FIG. 9C.

In the first embodiment, as illustrated in FIG. 4B, the non-doped second polycrystalline silicon layer 322 is formed on the second and third gate insulating films 314 and 315 and also on the trench gate electrode. After that, in the regions in which the N-type MOS transistors and the P-type MOS transistors are to be formed, high concentration impurities are introduced with use of separate masks by an ion implantation method, to thereby form the N-type second gate electrode 316 and the P-type second gate electrode 317. However, in the second embodiment, the non-doped second polycrystalline silicon layer 322 is formed (FIG. 9B), the second polycrystalline silicon layer 322 is patterned to form the gate electrodes without introducing impurities (FIG. 9C), and subsequently, the oxide film spacer 323 is formed (FIG. 10A).

Figure 10B:
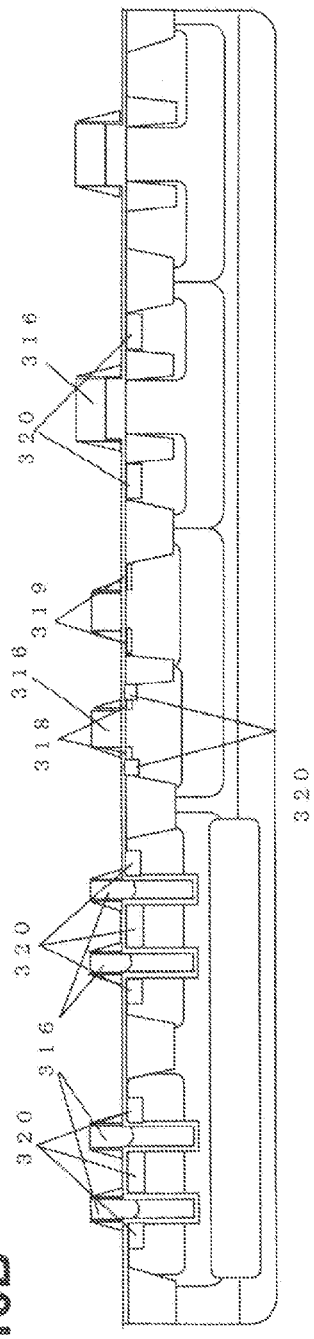

Then, as illustrated in FIG. 10B, when N-type high concentration impurities are introduced by an ion implantation method in the region of the N-type lateral MOS transistor formation region of the low breakdown voltage element 102 on the P-type second well layer 304, the region being separated from the second gate electrode 316 thereof by a desired distance, and in the surface region of the N-type vertical MOS transistor formation region, the surface region being provided in contact with the trench 310, to thereby form the sources and drains 320, the N-type high concentration impurities are also introduced into the non-doped second polycrystalline silicon layer 322. Thus, the N-type second gate electrode 316 is formed.

Figure 10C:
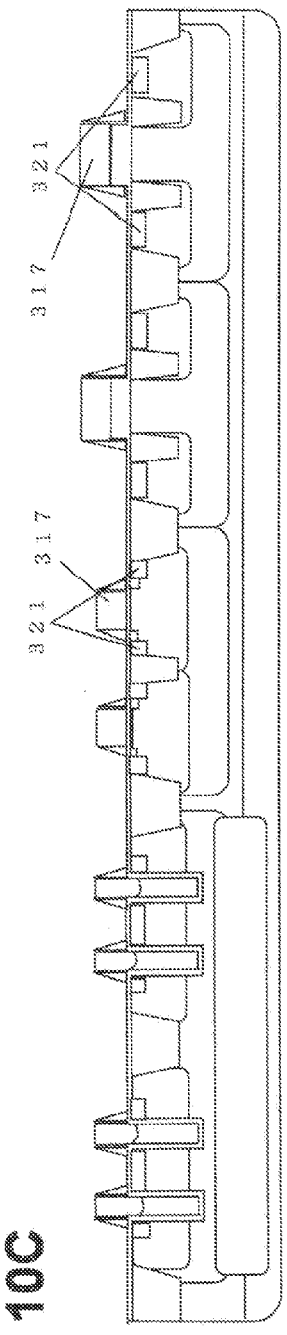
Figure 11A:
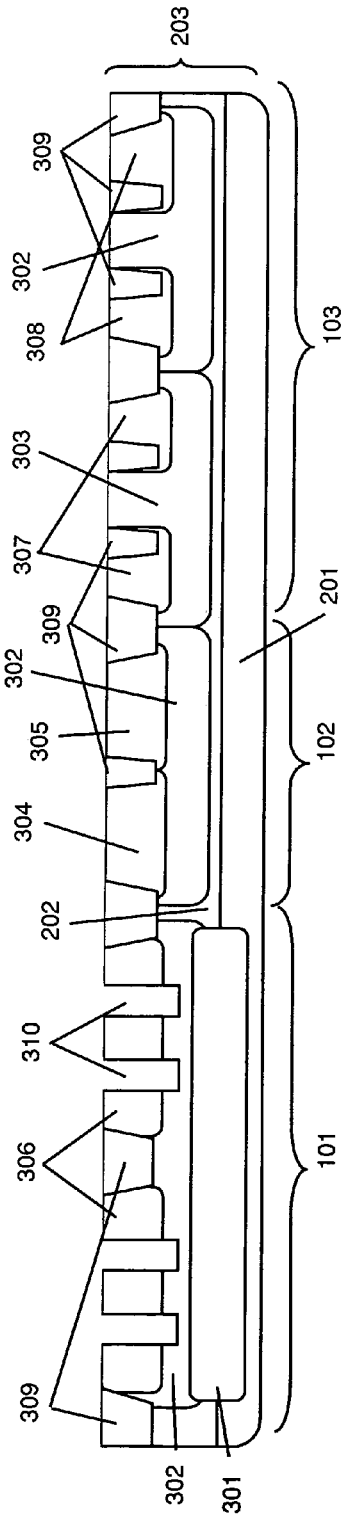
FIGS. 11A to 11C are schematic sectional views of a conventional method of manufacturing a semiconductor device.
Figure 11B:
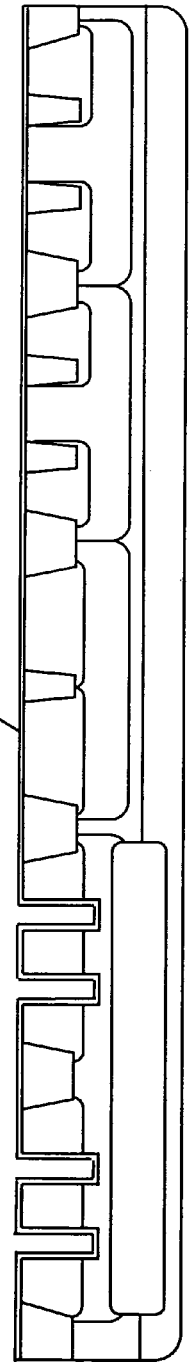
Figure 11C:
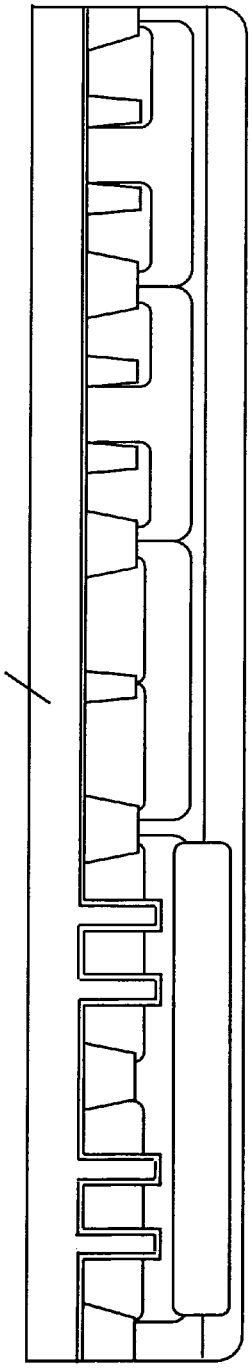
Figure 12A:
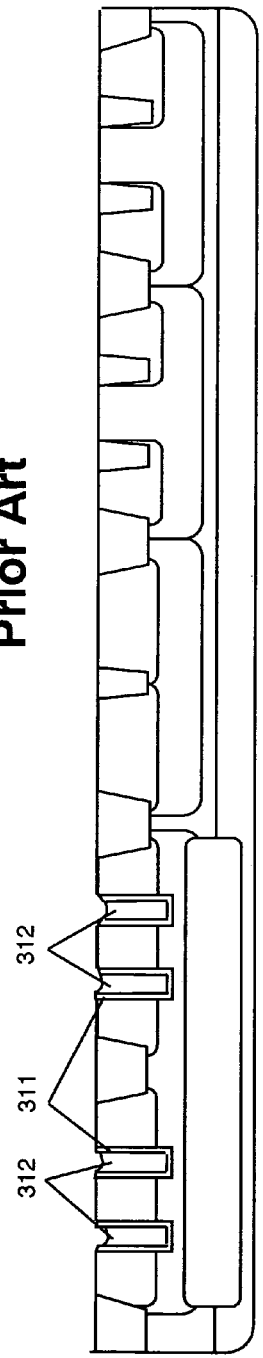
FIGS. 12A to 12C are schematic sectional views of the conventional method of manufacturing a semiconductor device, which follow FIG. 11C.
Figure 12B:
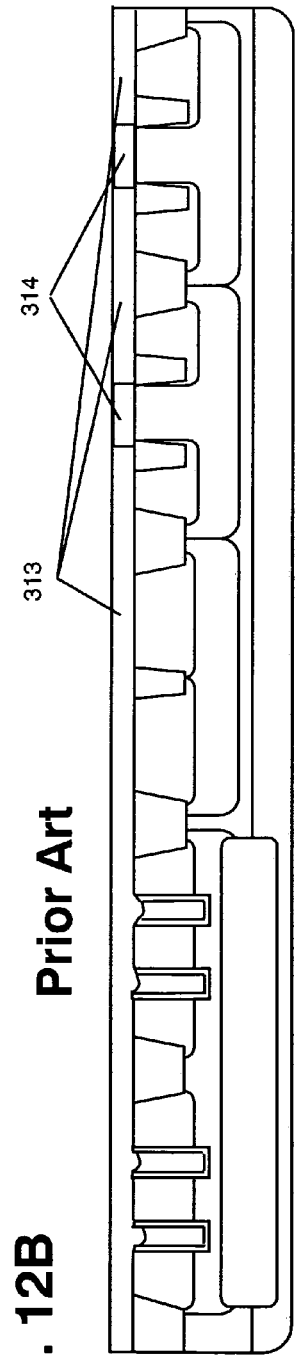
Figure 12C:
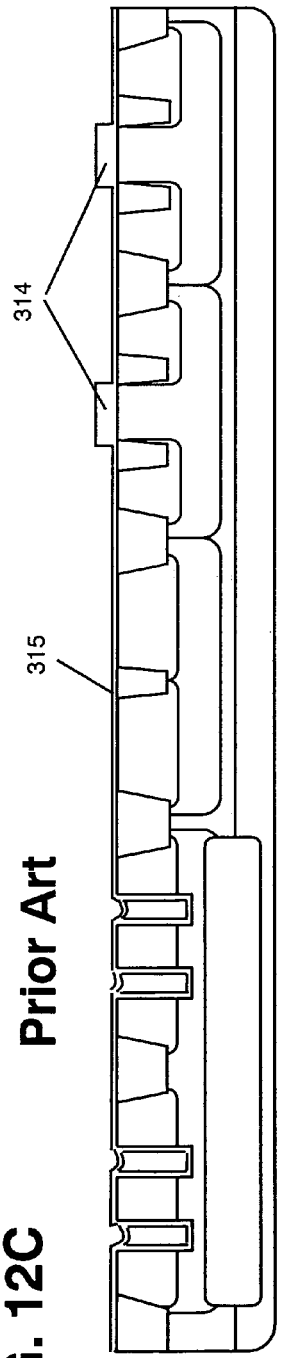
Figure 13A:
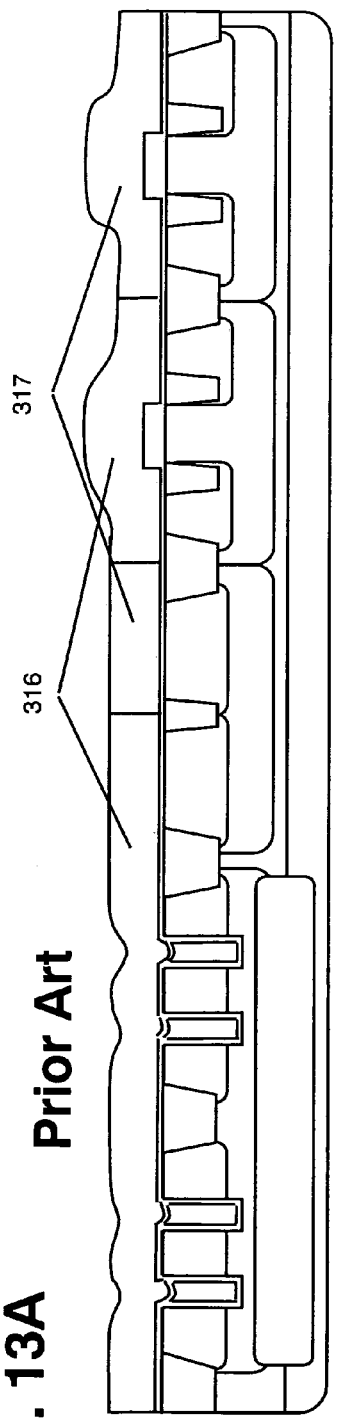
FIGS. 13A to 13C are schematic sectional views of the conventional method of manufacturing a semiconductor device, which follow FIG. 12C.
Figure 13B:
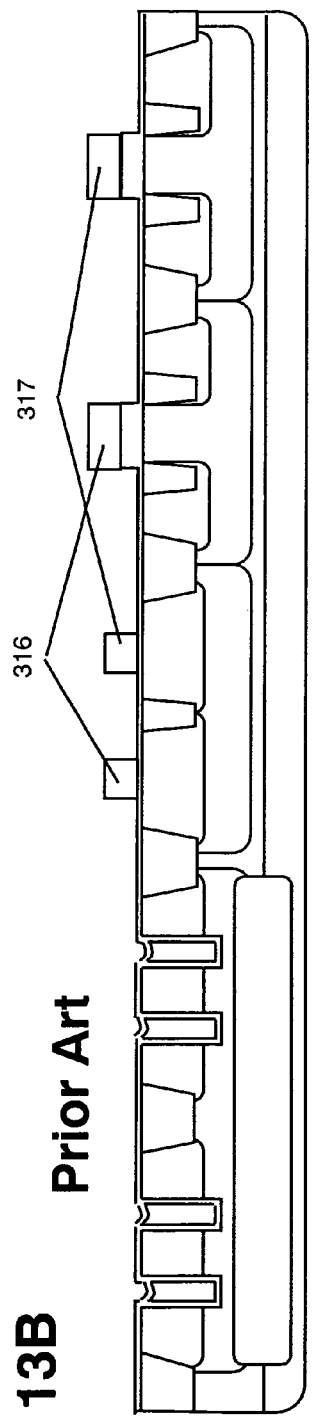
Figure 13C:
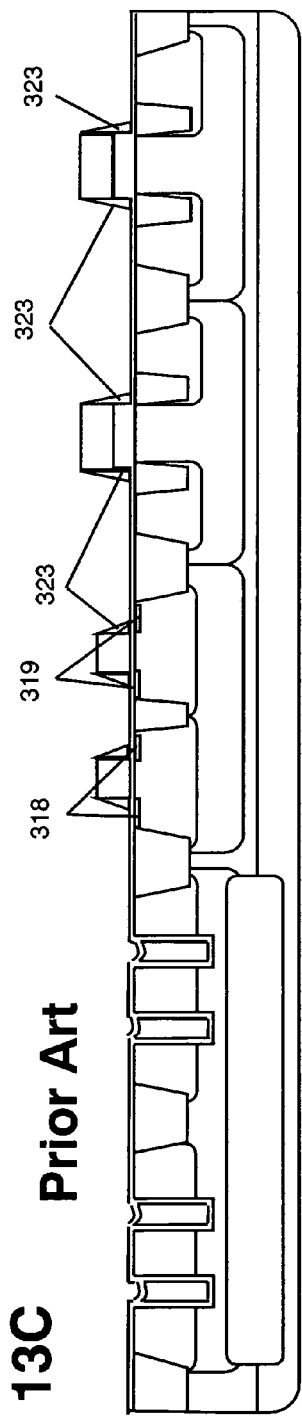

Further, as illustrated in FIG. 10C, regarding the P-type MOS transistor, similarly to the case of the N-type, the source and drain formation and the high concentration impurity doping into the P-type second gate electrode 317 are simultaneously carried out. With the configuration as described above, as compared to the method of manufacturing a semiconductor device described in the first embodiment, the number of masks to be used for forming the N-type and P-type second gate electrodes can be reduced, and hence the cost can be reduced.

What is claimed is:

1. A method of manufacturing a semiconductor device, comprising:

an N-type buried layer forming step of forming an N-type buried layer on a base substrate made of a P-type semiconductor;

an epitaxial growth layer forming step of forming a P-type epitaxial growth layer on the base substrate, to thereby form a semiconductor substrate;

a P-type first well layer forming step of forming a P-type first well layer in a region in which an N-type first lateral MOS transistor having a low breakdown voltage is to be formed;

an N-type first well layer forming step of forming an N-type first well layer in a region in which a P-type second lateral MOS transistor having a low breakdown voltage is to be formed;

a P-type second well layer forming step of forming a P-type second well layer in a region in which an N-type third lateral MOS transistor having a high breakdown voltage is to be formed;

an N-type second well layer forming step of forming an N-type second well layer in each of a region in which a P-type fourth lateral MOS transistor having a high breakdown voltage is to be formed and a region in which an N-type vertical MOS transistor is to be formed;

a body region forming step of forming a P-type body region in a region of the N-type second well layer, in which the N-type vertical MOS transistor is to be formed;

a step of forming, with an insulating film, an element isolation region and an electric field relaxation region of each of the N-type third lateral MOS transistor and the P-type fourth lateral MOS transistor;

a step of forming a first low concentration region in the electric field relaxation region;
a trench forming step of forming a trench in the region in which the N-type vertical MOS transistor is to be formed by performing anisotropic etching toward an inside of the semiconductor substrate so as to have a depth that does not reach the N-type buried layer;
a first gate insulating film forming step of forming a first gate insulating film along a surface of the semiconductor substrate and a wall surface of the trench;
a first polycrystalline silicon layer forming step of forming an N-type first polycrystalline silicon layer on the first gate insulating film;
a first gate electrode forming step of subjecting the N-type first polycrystalline silicon layer to etching to form a first gate electrode inside the trench;
a second gate insulating film forming step of forming a relatively-thick second gate insulating film in a region in which a gate insulating film of each of the N-type third lateral MOS transistor and the P-type fourth lateral MOS transistor is to be formed;
a third gate insulating film forming step of forming a relatively-thin third gate insulating film on the semiconductor substrate for the N-type first lateral MOS transistor and the P-type second lateral MOS transistor;
an etching step of removing the relatively-thin third gate insulating film on the first gate electrode in the trench;
a second polycrystalline silicon layer forming step of forming a non-doped second polycrystalline silicon layer on the semiconductor substrate;
an introducing step of high concentration impurities into the non-doped second polycrystalline silicon layer, of introducing N-type high concentration impurities into the non-doped second polycrystalline silicon layer of each of the N-type first lateral MOS transistor and the N-type third lateral MOS transistor, and introducing P-type high concentration impurities into the non-doped second polycrystalline silicon layer of each of the P-type second lateral MOS transistor and the P-type fourth lateral MOS transistor;
a second gate electrode forming step of subjecting the second polycrystalline silicon layer to etching, to thereby form a second gate electrode on the first gate electrode, and a second gate electrode of each of the N-type first lateral MOS transistor, the P-type second lateral MOS transistor, the N-type third lateral MOS transistor, and the P-type fourth lateral MOS transistor;
a low concentration N-type region forming step of introducing N-type impurities into the region in which the N-type first lateral MOS transistor is to be formed in a self-aligning manner with use of the second gate electrode of the N-type first lateral MOS transistor as a mask, to thereby form a second low concentration N-type impurity region;
a low concentration P-type region forming step of introducing P-type impurities into the region in which the P-type second lateral MOS transistor is to be formed in a self-aligning manner with use of the second gate electrode of the P-type second lateral MOS transistor as a mask, to thereby form a second low concentration P-type impurity region;
an N-type source and drain forming step of introducing N-type impurities into a region of the region in which the N-type first lateral MOS transistor is to be formed, the region being separated from the second gate electrode of the N-type first lateral MOS transistor, and into a region of the region in which the N-type vertical MOS transistor is to be formed, the region being provided in contact with the trench, to thereby form a high concentration N-type impurity region; and
a P-type source and drain forming step of introducing P-type impurities into a region of the region in which the P-type second lateral MOS transistor is to be formed, the region being separated from the second gate electrode of the P-type second lateral MOS transistor, to thereby form a high concentration P-type impurity region.

2. A method of manufacturing a semiconductor device, comprising:
an N-type buried layer forming step of forming an N-type buried layer on a base substrate made of a P-type semiconductor;
an epitaxial growth layer forming step of forming a P-type epitaxial growth layer on the base substrate, to thereby form a semiconductor substrate;
a P-type first well layer forming step of forming a P-type first well layer in a region in which an N-type first lateral MOS transistor having a low breakdown voltage is to be formed;
an N-type first well layer forming step of forming an N-type first well layer in a region in which a P-type second lateral MOS transistor having a low breakdown voltage is to be formed;
a P-type second well layer forming step of forming a P-type second well layer in a region in which an N-type third lateral MOS transistor having a high breakdown voltage is to be formed;
an N-type second well layer forming step of forming an N-type second well layer in a region in which an N-type vertical MOS transistor is to be formed;
a body region forming step of forming a P-type body region in a region of the N-type second well layer, in which the N-type vertical MOS transistor is to be formed;
a step of forming, with an insulating film, an element isolation region and an electric field relaxation region of the N-type third lateral MOS transistor;
a step of forming a first low concentration region in the electric field relaxation region;
a trench forming step of forming a trench in the region in which the N-type vertical MOS transistor is to be formed by performing anisotropic etching toward an inside of the semiconductor substrate so as to have a depth that does not reach the N-type buried layer;
a first gate insulating film forming step of forming a first gate insulating film along a surface of the semiconductor substrate and a wall surface of the trench;
a first polycrystalline silicon layer forming step of forming an N-type first polycrystalline silicon layer on the first gate insulating film;
a first gate electrode forming step of subjecting the N-type first polycrystalline silicon layer to etching to form a first gate electrode inside the trench;
a second gate insulating film forming step of forming a relatively-thick second gate insulating film in a region in which a gate insulating film of the N-type third lateral MOS transistor is to be formed;
a third gate insulating film forming step of forming a relatively-thin third gate insulating film on the semiconductor substrate for the N-type first lateral MOS transistor and the P-type second lateral MOS transistor;
an etching step of removing the relatively-thin third gate insulating film on the first gate electrode in the trench;
a second polycrystalline silicon layer forming step of forming a non-doped second polycrystalline silicon layer on the semiconductor substrate;

an introducing step of high concentration impurities into the non-doped second polycrystalline silicon layer, of introducing N-type high concentration impurities into the non-doped second polycrystalline silicon layer of each of the N-type first lateral MOS transistor and the N-type third lateral MOS transistor, and introducing P-type high concentration impurities into the non-doped second polycrystalline silicon layer of the P-type second lateral MOS transistor;

a second gate electrode forming step of subjecting the second polycrystalline silicon layer to etching, to thereby form a second gate electrode on the first gate electrode, and a second gate electrode of each of the N-type first lateral MOS transistor, the P-type second lateral MOS transistor, and the N-type third lateral MOS transistor;

a low concentration N-type region forming step of introducing N-type impurities into the region in which the N-type first lateral MOS transistor is to be formed in a self-aligning manner with use of the second gate electrode of the N-type first lateral MOS transistor as a mask, to thereby form a second low concentration N-type impurity region;

a low concentration P-type region forming step of introducing P-type impurities into the region in which the P-type second lateral MOS transistor is to be formed in a self-aligning manner with use of the second gate electrode of the P-type second lateral MOS transistor as a mask, to thereby form a second low concentration P-type impurity region;

an N-type source and drain forming step of introducing N-type impurities into a region of the region in which the N-type first lateral MOS transistor is to be formed, the region being separated from the second gate electrode of the N-type first lateral MOS transistor, and into a region of the region in which the N-type vertical MOS transistor is to be formed, the region being provided in contact with the trench, to thereby form a high concentration N-type impurity region; and a P-type source and drain forming step of introducing P-type impurities into a region of the region in which the P-type second lateral MOS transistor is to be formed, the region being separated from the second gate electrode of the P-type second lateral MOS transistor, to thereby form a high concentration P-type impurity region.

3. A method of manufacturing a semiconductor device, comprising:

an N-type buried layer forming step of forming an N-type buried layer on a base substrate made of a P-type semiconductor;

an epitaxial growth layer forming step of forming a P-type epitaxial growth layer on the base substrate, to thereby form a semiconductor substrate;

a P-type first well layer forming step of forming a P-type first well layer in a region in which an N-type first lateral MOS transistor having a low breakdown voltage is to be formed;

an N-type first well layer forming step of forming an N-type first well layer in a region in which a P-type second lateral MOS transistor having a low breakdown voltage is to be formed;

an N-type second well layer forming step of forming an N-type second well layer in a region in which an N-type vertical MOS transistor is to be formed;

a body region forming step of forming a P-type body region in a region of the N-type second well layer, in which the N-type vertical MOS transistor is to be formed;

a step of forming, with an insulating film, an element isolation region;

a trench forming step of forming a trench in the region in which the N-type vertical MOS transistor is to be formed by performing anisotropic etching toward an inside of the semiconductor substrate so as to have a depth that does not reach the N-type buried layer;

a first gate insulating film forming step of forming a first gate insulating film along a surface of the semiconductor substrate and a wall surface of the trench;

a first polycrystalline silicon layer forming step of forming an N-type first polycrystalline silicon layer on the first gate insulating film;

a first gate electrode forming step of subjecting the N-type first polycrystalline silicon layer to etching to form a first gate electrode inside the trench;

a third gate insulating film forming step of forming a third gate insulating film on the semiconductor substrate for the N-type first lateral MOS transistor and the P-type second lateral MOS transistor;

an etching step of removing the third gate insulating film on the first gate electrode in the trench;

a second polycrystalline silicon layer forming step of forming a non-doped second polycrystalline silicon layer on the semiconductor substrate;

an introducing step of high concentration impurities into the non-doped second polycrystalline silicon layer, of introducing N-type high concentration impurities into the non-doped second polycrystalline silicon layer of the N-type first lateral MOS transistor, and introducing P-type high concentration impurities into the non-doped second polycrystalline silicon layer of the P-type second lateral MOS transistor;

a second gate electrode forming step of subjecting the second polycrystalline silicon layer to etching, to thereby form a second gate electrode on the first gate electrode, and a second gate electrode of each of the N-type first lateral MOS transistor and the P-type second lateral MOS transistor;

a low concentration N-type region forming step of introducing N-type impurities into the region in which the N-type first lateral MOS transistor is to be formed in a self-aligning manner with use of the second gate electrode of the N-type first lateral MOS transistor as a mask, to thereby form a second low concentration N-type impurity region;

a low concentration P-type region forming step of introducing P-type impurities into the region in which the P-type second lateral MOS transistor is to be formed in a self-aligning manner with use of the second gate electrode of the P-type second lateral MOS transistor as a mask, to thereby form a second low concentration P-type impurity region;

an N-type source and drain forming step of introducing N-type impurities into a region of the region in which the N-type first lateral MOS transistor is to be formed, the region being separated from the second gate electrode of the N-type first lateral MOS transistor, and into a region of the region in which the N-type vertical MOS transistor is to be formed, the region being provided in contact with the trench, to thereby form a high concentration N-type impurity region; and a P-type source and drain forming step of introducing P-type impurities into a region of the region in which the P-type second lateral MOS transistor is to be formed, the region being separated from the second gate electrode of the P-type second lateral MOS transistor, to thereby form a high concentration P-type impurity region.

4. A method of manufacturing a semiconductor device according to claim 1,
wherein the introducing of the N-type high concentration impurities in the introducing step of high concentration impurities into the non-doped second polycrystalline silicon layer is carried out simultaneously with the N-type source and drain forming step, and
wherein the introducing of the P-type high concentration impurities in the introducing step of high concentration impurities into the non-doped second polycrystalline silicon layer is carried out simultaneously with the P-type source and drain forming step.

5. A method of manufacturing a semiconductor device according to claim 2,
wherein the introducing of the N-type high concentration impurities in the introducing step of high concentration impurities into the non-doped second polycrystalline silicon layer is carried out simultaneously with the N-type source and drain forming step, and
wherein the introducing of the P-type high concentration impurities in the introducing step of high concentration impurities into the non-doped second polycrystalline silicon layer is carried out simultaneously with the P-type source and drain forming step.

6. A method of manufacturing a semiconductor device according to claim 3,
wherein the introducing of the N-type high concentration impurities in the introducing step of high concentration impurities into the non-doped second polycrystalline silicon layer is carried out simultaneously with the N-type source and drain forming step, and
wherein the introducing of the P-type high concentration impurities in the introducing step of high concentration impurities into the non-doped second polycrystalline silicon layer is carried out simultaneously with the P-type source and drain forming step.

\* \* \* \* \*